United States Patent
Park

(10) Patent No.: US 7,226,854 B2
(45) Date of Patent: Jun. 5, 2007

(54) METHODS OF FORMING METAL LINES IN SEMICONDUCTOR DEVICES

(75) Inventor: Cheolsoo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/746,652

(22) Filed: Dec. 26, 2003

(65) Prior Publication Data

US 2004/0137716 A1   Jul. 15, 2004

(30) Foreign Application Priority Data

Dec. 30, 2002   (KR)   ............... 10-2002-0086402

(51) Int. Cl.
*H01L 21/4763*   (2006.01)
*H01L 21/44*   (2006.01)
*H01L 21/302*   (2006.01)
*H01L 21/461*   (2006.01)

(52) U.S. Cl. ............. 438/622; 438/625; 438/648; 438/656; 438/666; 438/667; 438/669; 438/672; 438/685; 438/688; 438/720; 257/E21.166; 257/E21.167; 257/E21.168; 257/E21.243

(58) Field of Classification Search ........ 438/622, 438/625, 629, 648, 656, 666–667, 669, 672, 438/685, 688, 720

See application file for complete search history.

(56) References Cited

U.S. PATENT DOCUMENTS

| 4,840,923 | A | * | 6/1989 | Flagello et al. ............. 216/18 |
| 4,866,009 | A | * | 9/1989 | Matsuda .................. 438/471 |
| 5,043,297 | A | * | 8/1991 | Suzuki et al. ............. 438/598 |
| 5,136,362 | A | | 8/1992 | Grief et al. ................ 357/67 |
| 5,204,286 | A | * | 4/1993 | Doan ...................... 438/618 |
| 5,284,799 | A | | 2/1994 | Sato ...................... 437/189 |
| 5,312,777 | A | * | 5/1994 | Cronin et al. .............. 438/20 |
| 5,530,262 | A | * | 6/1996 | Cronin et al. .............. 257/10 |
| 5,759,914 | A | * | 6/1998 | Park ...................... 438/624 |
| 5,840,627 | A | * | 11/1998 | Huggins .................. 438/669 |
| 5,840,923 | A | * | 11/1998 | Roberts et al. ............ 549/311 |

(Continued)

FOREIGN PATENT DOCUMENTS

JP   08-167589   6/1996

OTHER PUBLICATIONS

Takashi Ito et al.; Semiconductor Device and Manufacture Thereof; Patent Abstracts of Japan; Publication No. 08-167589; Publication Date Jun. 25, 1998; 2 Pgs.; Japan Patent Office.

*Primary Examiner*—Michael Lebentritt
*Assistant Examiner*—Mohsen Ahmadi
(74) *Attorney, Agent, or Firm*—Andrew D. Fortney

(57) ABSTRACT

Methods of forming metal lines in semiconductor devices are disclosed. One example method may include forming lower metal lines and forming an insulation layer on the lower metal lines; etching said insulation layer to a depth; and depositing a material for upper metal lines on the entire surface of said insulation layer and planarizing the material for the upper metal lines to form said upper metal lines. The example method may also include exposing the lower metal lines by etching said upper metal lines and the insulation layer and depositing a material for contact plugs on the entire surfaces of said upper metal lines and said insulation layer and planarizing the material for said contact plugs to form the contact plugs.

18 Claims, 2 Drawing Sheets

U.S. PATENT DOCUMENTS

| | | | |
|---|---|---|---|
| 6,060,330 A * | 5/2000 | Huggins et al. | 438/12 |
| 6,130,102 A | 10/2000 | White, Jr. et al. | 438/3 |
| 6,313,027 B1 | 11/2001 | Xu et al. | 438/627 |
| 6,395,381 B1 | 5/2002 | Kondo et al. | 428/317 |
| 6,436,823 B1 | 8/2002 | Cabral, Jr. et al. | 438/686 |

* cited by examiner

METHODS OF FORMING METAL LINES IN SEMICONDUCTOR DEVICES

TECHNICAL FIELD

The present disclosure relates to semiconductor devices and fabrication and, more particularly, to methods of forming metal lines in semiconductor devices.

BACKGROUND

Generally, when forming metal lines in semiconductor devices it is conventional to sequentially form lower metal lines, contact plugs and upper metal lines such that the lower and the upper metal lines are connected via the contact plugs. For example, U.S. Pat. Nos. 6,130,102 and 5,284,799 disclose a method for forming contact plugs by a dual damascene process, wherein upper metal lines are formed on the contact plugs. In such conventional processes, an overlap ratio between the contact plugs and the upper metal lines or the lower metal lines is greater than zero, thereby making it difficult to apply nanotechnology to the semiconductor device fabrication.

DETAILED DESCRIPTION OF THE PREFERRED EMBODIMENTS

Figure 1A:
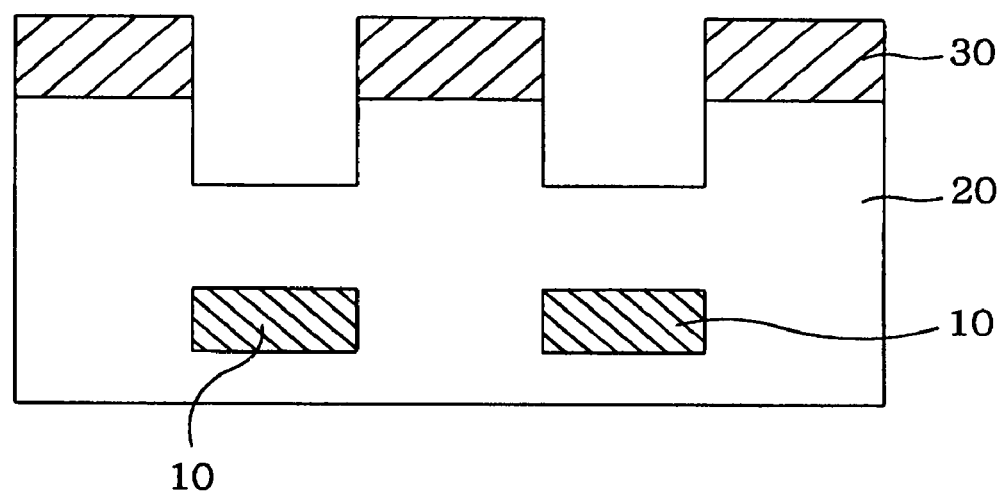
FIGS. 1A to 1D illustrate cross sectional views showing an example process for forming metal lines in a semiconductor device.

Referring to FIG. 1A, lower metal lines 10 are formed and an insulation layer 20 is thickly deposited thereon. The insulation layer 20 may be planarized by a chemical mechanical polishing ("CMP") process. After the CMP process, a first photoresist pattern 30 is formed on the insulation layer 20. A first dry etching process is then performed on the insulation layer 20 using the first photoresist pattern 30 as a mask, wherein the etched parts have a depth equal to a thickness of upper metal lines to be formed later.

Figure 1B:
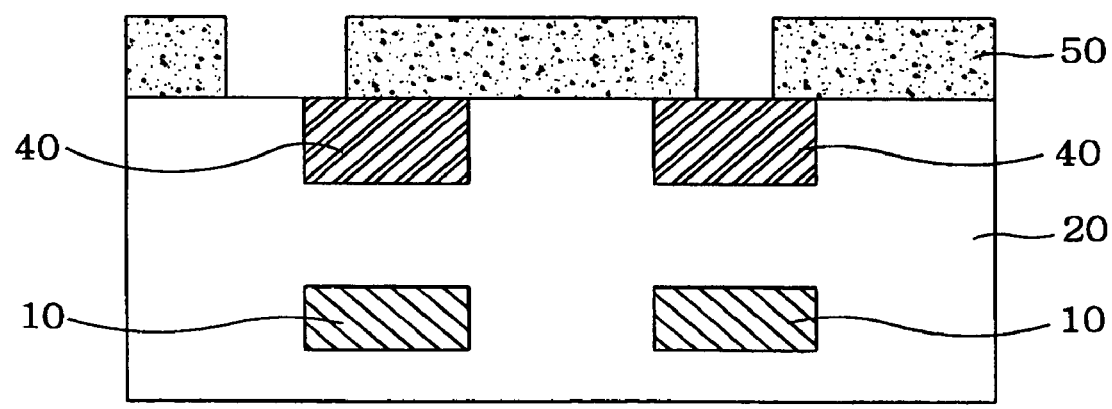

Then, as shown in FIG. 1B, after the first photoresist pattern 30 is removed, a material for the upper metal lines 40, e.g., blanked W, chemical vapor deposition (hereinafter referred to as "CVD") Al, CVD TiN or TaN, is deposited on the insulation layer 20 and planarized by a CMP process to form the upper metal lines 40. Subsequently, a second photoresist pattern 50 is formed.

Figure 1C:
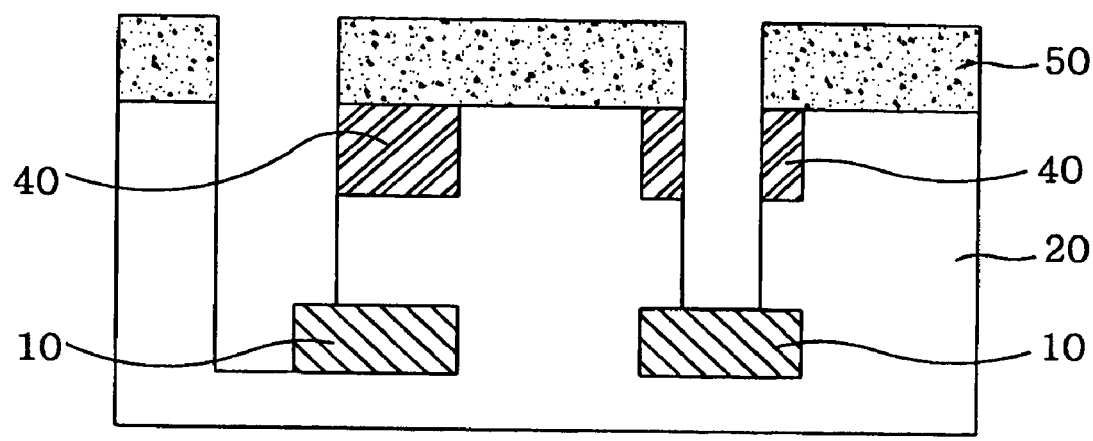

Referring to FIG. 1C, the upper metal lines 40 and the insulation layer 20 are etched by a second dry etching process using the second photoresist pattern 50 as a mask until the lower metal lines 10 are exposed. In the second dry etching process, an etchant having a higher selectivity for the insulation layer 20 than that of the upper metal line 40 is used so that the insulation layer 20 is etched beyond a top surface of one of the lower metal lines 10 as shown in FIG. 1C. Alternatively, another etchant having about 1:1 selectivity between the upper metal line 40 and the insulation layer 20 may be used in the second dry etching process.

Figure 1D:
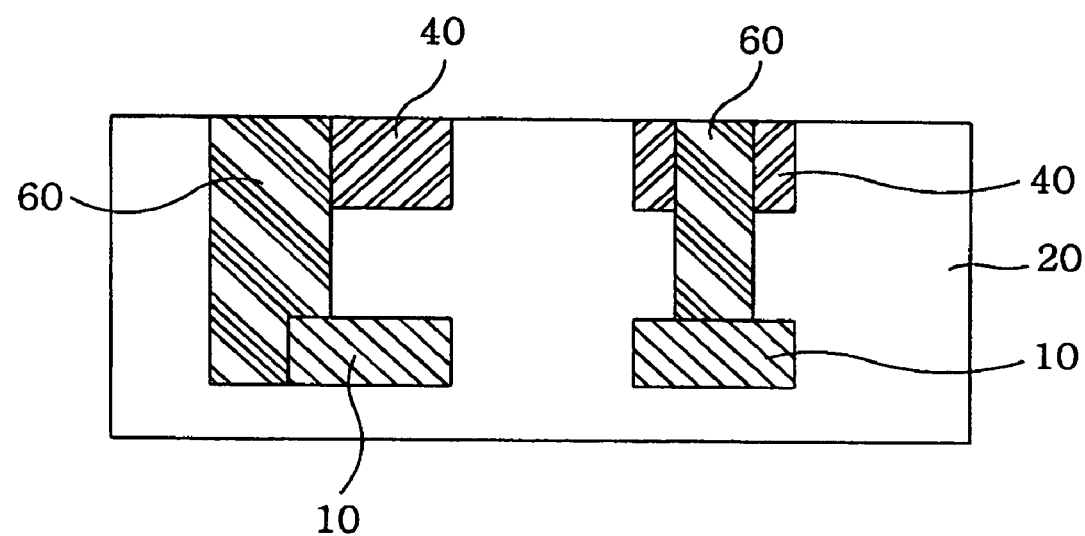

Referring to FIG. 1D, after the second photoresist pattern 50 is removed, a material for contact plugs 60, e.g., CVD TaN, TiN, blanked W, or CVD Al, is deposited on the resultant structure and planarized by the CMP process to form the contact plugs 60 for connecting the upper metal lines 40 to the lower metal lines 10.

In accordance with the disclosed process, the lower and the upper metal lines are formed without forming via holes, and the contact plugs are formed by penetrating the upper metal lines, thereby allowing an overlap ratio between the contact plugs and the upper metal lines or the lower metal lines to be zero. As a result, the contact areas between the contact plugs and the upper metal lines/the lower metal lines are increased, thereby improving an electromigration ("EM") characteristic.

Although certain methods are described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming metal lines in a semiconductor device, the method comprising:
    forming lower metal lines and forming an insulation layer on the lower metal lines;
    partially etching said insulation layer to a depth which upper metal lines are to be formed;
    depositing a material for the upper metal lines on the entire surface of said insulation layer and planarizing the material for the upper metal lines to form said upper metal lines;
    exposing the lower metal lines by forming a photoresist pattern on the entire surface of the resultant structure, performing a dry etching process on the upper metal lines and said insulation layer using an etchant having about 1:1 selectivity between said upper metal line and said insulation layer until said lower metal lines are exposed to form contact holes through said upper metal lines and the insulation layer, and removing said photoresist pattern; and
    depositing a material for contact plugs on entire exposed surfaces of said upper metal lines, said insulation layer, and said contact holes, and planarizing the material for said contact plugs to form the contact plugs, wherein the material for contact plugs is deposited in the contact hole while the upper surfaces of the upper metal lines are completely exposed, thereby placing the material for the contact plugs in contact with exposed surfaces of said upper metal lines and said insulation layer, and forming an electrical connection between the lower and the upper metal lines via the contact plugs.

2. A method as defined by claim 1, wherein said material for said upper metal lines is selected from the group consisting of W, CVD Al, CVD TiN and TaN.

3. A method as defined by claim 2, wherein said material for said upper metal lines comprises CVD TiN.

4. A method as defined by claim 1, wherein said material for said contact plugs is selected from the group consisting of CVD TaN, TiN, W and CVD Al.

5. A method as defined by claim 4, wherein said material for said upper metal lines is selected from the group consisting of W, CVD Al, CVD TiN and TaN.

6. A method as defined by claim 5, wherein said material for said upper metal lines comprises CVD TiN, and said material for said contact plugs comprises W.

7. A method as defined by claim 4, wherein said material for said contact plugs comprises W.

8. A method as defined by claim 1, wherein forming the insulation layer comprises depositing the insulation layer, then planarizing the insulation layer by a chemical mechanical polishing ("CMP") process.

9. A method as defined by claim 1, wherein planarizing the material for the upper metal lines comprises a chemical mechanical polishing ("CMP") process.

10. A method of forming metal lines in a semiconductor device, the method comprising:

forming lower metal lines and forming an insulation layer on the lower metal lines;

partially etching said insulation layer to a depth which upper metal lines are to be formed;

depositing a material for the upper metal lines on the entire surface of said insulation layer and planarizing the material for the upper metal lines to form said upper metal lines;

exposing the lower metal lines by:
forming a photoresist pattern on the entire surface of the resultant structure;
performing a dry etching process on said upper metal lines and said insulation layer using an etchant having a higher selectivity for said insulation layer than that for said upper metal lines until the lower metal lines are exposed; and
removing said photoresist pattern; and depositing a material for contact plugs on entire exposed surfaces of said upper metal lines, said insulation layer, and said contact holes, and planarizing the material for said contact plugs to form the contact plugs, wherein the material for contact plugs is deposited in the contact hole while the upper surfaces of the upper metal lines are completely exposed, thereby placing the material for the contact plugs in contact with exposed surfaces of said upper metal lines and said insulation layer, and forming an electrical connection between the lower and the upper metal lines via the contact plugs.

11. A method as defined by claim 10, wherein said material for said upper metal lines is selected from the group consisting of W, CVD Al, CVD TiN and TaN.

12. A method as defined by claim 11, wherein said material for said upper metal lines comprises CVD TiN.

13. A method as defined by claim 11, wherein said material for said contact plugs is selected from the group consisting of CVD TaN, TiN, W and CVD Al.

14. A method as defined by claim 13, wherein said material for said upper metal lines comprises CVD TiN, and said material for said contact plugs comprises W.

15. A method as defined by claim 10, wherein said material for said contact plugs is selected from the group consisting of CVD TaN, TiN, W and CVD Al.

16. A method as defined by claim 15, wherein said material for said contact plugs comprises W.

17. A method as defined by claim 10, wherein forming the insulation layer comprises depositing the insulation layer, then planarizing the insulation layer by a chemical mechanical polishing ("CMP") process.

18. A method as defined by claim 10, wherein planarizing the material for the upper metal lines comprises a chemical mechanical polishing ("CMP") process.

* * * * *